US010095417B1

(12) United States Patent
Jeon et al.

(10) Patent No.: US 10,095,417 B1
(45) Date of Patent: Oct. 9, 2018

(54) METHOD AND SYSTEM FOR IMPROVING FLASH STORAGE READ PERFORMANCE IN PARTIALLY PROGRAMMED BLOCKS

(71) Applicant: EMC IP Holding Company LLC, Hopkinton, MA (US)

(72) Inventors: Seungjune Jeon, Santa Clara, CA (US); Haleh Tabrizi, San Francisco, CA (US); Alan Hanson, Oakland, CA (US); Andrew Cullen, Midleton (IE); Justin Ha, Daly City, CA (US); Michael Rijo, Stoughton, MA (US); Samuel Hudson, Framingham, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 112 days.

(21) Appl. No.: 15/377,210

(22) Filed: Dec. 13, 2016

(51) Int. Cl.
*G06F 12/08* (2016.01)
*G06F 3/06* (2006.01)
(Continued)

(52) U.S. Cl.
CPC ............ *G06F 3/061* (2013.01); *G06F 3/0655* (2013.01); *G06F 3/0688* (2013.01);
(Continued)

(58) Field of Classification Search
CPC ......... G06F 12/00; G06F 12/08; G06F 3/0679
(Continued)

(56) References Cited

U.S. PATENT DOCUMENTS 6,016,275 A  1/2000 Han
6,862,675 B1 * 3/2005 Wakimoto ............ G06F 9/3802
                                                              711/123
(Continued)

FOREIGN PATENT DOCUMENTS

CN    102150140 A    8/2011
CN    103902234 A    7/2014
(Continued)

OTHER PUBLICATIONS

Hyojin Choi et al.; "VLSI Implementation of BCH Error Correction for Multilevel Cell NAND Flash Memory"; IEEE Transactions on Very Large Scale Integration (VLSI) Systems; vol. 18, No. 5; pp. 843-847; May 2010 (5 pages).
(Continued)

*Primary Examiner* — Tuan Thai
(74) *Attorney, Agent, or Firm* — Chamberlain Hrdlicka

(57) ABSTRACT

A method for reading data from persistent storage. The method includes receiving a client read request for data from a client. The client read request includes a logical address. The method further includes determining a physical address corresponding to the logical address, determining that the physical address is directed to an open block in the persistent storage and determining that the physical address is directed to a last closed word line of the open block. The method further includes, based on these determinations, obtaining at least one read threshold value for the reading from last closed word lines, issuing a control module read request comprising the at least one read threshold value to a storage module that includes the open block, and obtaining the data from the open block using the at least one read threshold value.

20 Claims, 10 Drawing Sheets

(51) Int. Cl.
*G11C 11/56* (2006.01)
*G06F 12/02* (2006.01)

(52) U.S. Cl.
CPC ...... *G06F 12/0246* (2013.01); *G11C 11/5628* (2013.01); *G11C 11/5635* (2013.01); *G11C 11/5642* (2013.01); *G06F 2212/7201* (2013.01)

(58) Field of Classification Search
USPC .......................................... 711/100, 103, 154
See application file for complete search history.

(56) References Cited

U.S. PATENT DOCUMENTS

| | | | |
|---|---|---|---|
| 7,559,004 | B1 | 7/2009 | Chang et al. |
| 8,189,379 | B2 | 5/2012 | Camp et al. |
| 8,259,506 | B1 | 9/2012 | Sommer et al. |
| 8,305,812 | B2 | 11/2012 | Levy et al. |
| 8,335,893 | B2 * | 12/2012 | Tagawa ............... G06F 12/0246 711/1 |
| 8,819,503 | B2 | 8/2014 | Melik-Martirosian |
| 8,868,842 | B2 | 10/2014 | Yano et al. |
| 9,026,764 | B2 * | 5/2015 | Hashimoto ......... G06F 12/0246 711/103 |
| 9,195,586 | B2 | 11/2015 | Cometti et al. |
| 9,564,233 | B1 | 2/2017 | Cho et al. |
| 9,690,655 | B2 | 6/2017 | Tabrizi et al. |
| 9,710,180 | B1 | 7/2017 | Van Gaasbeck |
| 9,905,289 | B1 | 2/2018 | Jeon et al. |
| 2005/0223185 | A1* | 10/2005 | Lee .................... G06F 12/0292 711/170 |
| 2009/0144598 | A1 | 6/2009 | Yoon et al. |
| 2010/0332923 | A1 | 12/2010 | D'Abreu et al. |
| 2011/0173484 | A1 | 7/2011 | Schuette et al. |
| 2011/0202818 | A1 | 8/2011 | Yoon et al. |
| 2012/0192035 | A1 | 7/2012 | Nakanishi |
| 2012/0236656 | A1 | 9/2012 | Cometti |
| 2012/0239991 | A1 | 9/2012 | Melik-Martirosian |
| 2012/0268994 | A1 | 10/2012 | Nagashima |
| 2012/0290899 | A1 | 11/2012 | Cideciyan et al. |
| 2013/0094286 | A1 | 4/2013 | Sridharan et al. |
| 2013/0176784 | A1 | 7/2013 | Cometti et al. |
| 2013/0227200 | A1 | 8/2013 | Cometti et al. |
| 2014/0006688 | A1 | 1/2014 | Yu et al. |
| 2014/0181378 | A1 | 6/2014 | Saeki et al. |
| 2014/0229799 | A1 | 8/2014 | Hubris et al. |
| 2014/0359202 | A1 | 12/2014 | Sun et al. |
| 2015/0078094 | A1 | 3/2015 | Nagashima |
| 2015/0082121 | A1 | 3/2015 | Wu et al. |
| 2016/0092304 | A1 | 3/2016 | Tabrizi et al. |
| 2016/0093397 | A1 | 3/2016 | Tabrizi et al. |

FOREIGN PATENT DOCUMENTS

| | | |
|---|---|---|
| JP | 2011-100519 A | 5/2011 |
| JP | 2012-203957 A | 10/2012 |
| JP | 2013176784 A | 9/2013 |

OTHER PUBLICATIONS

Te-Hsuan Chen et al.; "An Adaptive-Rate Error Correction Scheme for NAND Flash Memory"; 27th IEEE VLSI Test Symposium; pp. 53-58; 2009 (6 pages).
Eran Gal et al.; "Algorithms and Data Structures for Flash Memories"; ACM Computing Surveys (CSUR); vol. 37, No. 2; pp. 138-163; Jun. 2005 (30 pages).
Mendel Rosenblum et al.; "The Design and Implementation of a Log-Structured File System"; ACM Transactions on Computer Systems; vol. 10; No. 1; pp. 26-52; Feb. 1992 (27 pages).
Chanik Park et al.; "A Reconfigurable FTL (Flash Translation Layer) Architecture for NAND Flash-Based Applications"; ACM Transactions on Embedded Computing Systems; vol. 7, No. 4, Article 38; Jul. 2008 (23 pages).
Yu Cai et al.; "Flash Correct-and-Refresh: Retention-Aware Error Management for Increased Flash Memory Lifetime"; Proceedings of the IEEE International Conference on Computer Design (ICCD); pp. 94-101; 2012 (10 pages).
Beomkyu Shin et al.; "Error Control Coding and Signal Processing for Flash Memories"; IEEE International Symposium on Circuits and Systems (ISCAS); pp. 409-412; 2012 (4 pages).
Haleh Tabrizi et al.; "A Learning-based Network Selection Method in Heterogeneous Wireless Systems"; IEEE Global Telecommunications Conference (GLOBECOM 2011); 2011 (5 pages).
Neal Mielke et al.; "Recovery Effects in the Distributed Cycling of Flash Memories"; IEEE 44th Annual International Reliability Physics Symposium; pp. 29-35; 2006 (7 pages).
Ramesh Pyndiah et al.; "Near Optimum Decoding of Product Codes"; Global Telecommunicaitons Conference (GLOBECOM '94), Communications: The Global Bridge pp. 339-343; 1994 (5 pages).
Junsheng Han et al.; "Reliable Memories with Subline Accesses"; International Symposium on Information Theory (ISIT); pp. 2531-2535, Jun. 2007 (5 pages).
Ankit Singh Rawat et al.; "Locality and Availability in Distributed Storage," arXiv:1402.2011v1 [cs.IT]; Feb. 10, 2014 (9 pages).
Parikshit Gopalan et al.; "On the Locality of Codeword Symbols"; arXiv:1106.3625v1[cs.IT]; Jun. 18, 2011 (17 pages).
Frédérique Oggier et al.; "Self-repairing Homomorphic Codes for Distributed Storage Systems"; IEEE INFOCOM 2011; pp. 1215-1223; 2011 (9 pages).
Dimitris Papailiopoulos et al.; "Simple Regenerating Codes: Network Coding for Cloud Storage"; arXiv:1109.0264v1 [cs.IT]; Sep. 1, 2011 (9 pages).
Osama Khan et al.; "In Search of I/O-Optimal Recovery from Disk Failures"; HotStorage 2011; Jun. 2011 (5 pages).
Cheng Huang et al.; "Pyramid Codes: Flexible Schemes to Trade Space for Access Efficiency in Reliable Data Storage Systems"; Sixth IEEE International Symposium on Network Computing and Applications (NCA); 2007 (8 pages).
Hongchao Zhou et al.; "Error-Correcting Schemes with Dynamic Thresholds in Nonvolatile Memories"; 2011 IEEE International Symposium on Information Theory Proceedings; pp. 2143-2147; 2011; (5 pages).
Borja Peleato et al.; "Towards Minimizing Read Time for NAND Flash"; Globecom 2012—Symposium on Selected Areas in Communication; pp. 3219-3224; 2012 (6 pages).
Yongjune Kim et al.; "Modulation Coding for Flash Memories"; 2013 International Conference on Computing, Networking and Communications, Data Storage Technology and Applications Symposium; pp. 961-967; 2013 (7 pages).
Yu Cai et al.; "Program Interference in MLC NAND Flash Memory: Characterization, Modeling, and Mitigation"; 2013 IEEE International Conference on Computer Design (ICCD); pp. 123-130; 2013 (8 pages).
Yu Cai et al.; "Threshold Voltage Distribution in MLC NAND Flash Memory: Characterization, Analysis, and Modeling"; Proceedings of the Conference on Design, Automation and Test in Europe; pp. 1285-1290; 2013 (6 pages).
Eitan Yaakobi et al.; Error Characterization and Coding Schemes for Flash Memories; IEEE Globecom 2010 Workshop on Application of Communication Theory to Emerging Memory Technologies; pp. 1856-1860; 2010 (5 pages).
Borja Peleato et al.; "Maximizing MLC NAND lifetime and reliability in the presence of write noise"; IEEE International Conference on Communications (ICC); pp. 3752-3756; 2012 (5 pages).

\* cited by examiner

METHOD AND SYSTEM FOR IMPROVING FLASH STORAGE READ PERFORMANCE IN PARTIALLY PROGRAMMED BLOCKS

BACKGROUND

One important performance metric for a storage system is the latency related to retrieving data stored in the storage system. The performance of the storage system improves with a decrease in the read latency. The read latency for a storage system may be decreased if the storage system is able to reliably retrieve error-free data from the storage medium. When error-free data is not retrieved, the storage system may perform additional actions in order to remove the errors from the retrieved data. For example, the storage system may perform additional read operations and/or use redundant arrays of independent disks (RAID) to remove errors from the retrieved data or otherwise generate error-free data. The use of error correcting mechanisms results in an increase in read latency, which is accompanied with a corresponding decrease in performance.

DETAILED DESCRIPTION

Figure 1A:
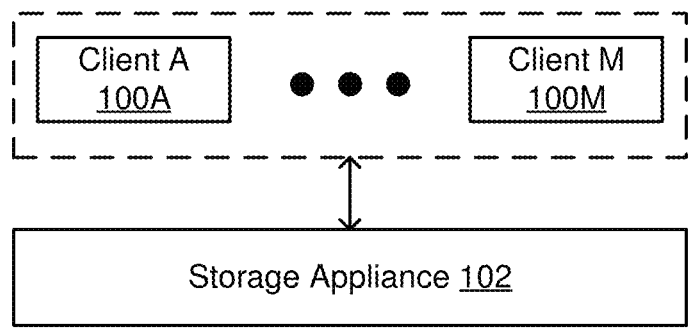
FIGS. 1A-1C show systems in accordance with one or more embodiments of the technology.

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description In the following description of FIGS. 1-8, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to increasing the utilization of solid-state storage by dynamically modifying read threshold values to appropriate levels based on knowledge of programmed and non-programmed regions in the flash storage. More specifically, embodiments of the technology relate to determining appropriate read threshold values for reading from memory cells that are in the vicinity of memory cells that have not yet been programmed.

The programming of a memory cell may cause interference in adjacent memory cells. In particular, the programming of a memory cell may result in the elevation of the voltage level in surrounding memory cells. The effect may be more prominent in immediately adjacent cells, and it may be less prominent in more remotely located cells. In one embodiment of the technology, to accommodate the voltage elevation, a cell, when programmed, is programmed to a voltage level below the target voltage level, such that when the adjacent memory cell(s) is programmed, the voltage is elevated to the target voltage level. Accordingly, when reading from a memory cell, the default read threshold value may only apply after the adjacent cell(s) have also been programmed, whereas a slightly lower read threshold value may be applicable prior to the programming of the adjacent memory cells.

In one or more embodiments of the technology, a determination is thus made regarding whether adjacent memory cells have been programmed or not, and the read threshold value is then chosen accordingly, thus increasing the likeliness of an error-free read operation. When error-free data is retrieved from the solid-state storage, there is no need to implement error correction mechanisms. As a result, the performance of the system increases.

The following description describes one or more systems and methods for implementing one or more embodiments of the technology.

Figure 1B:
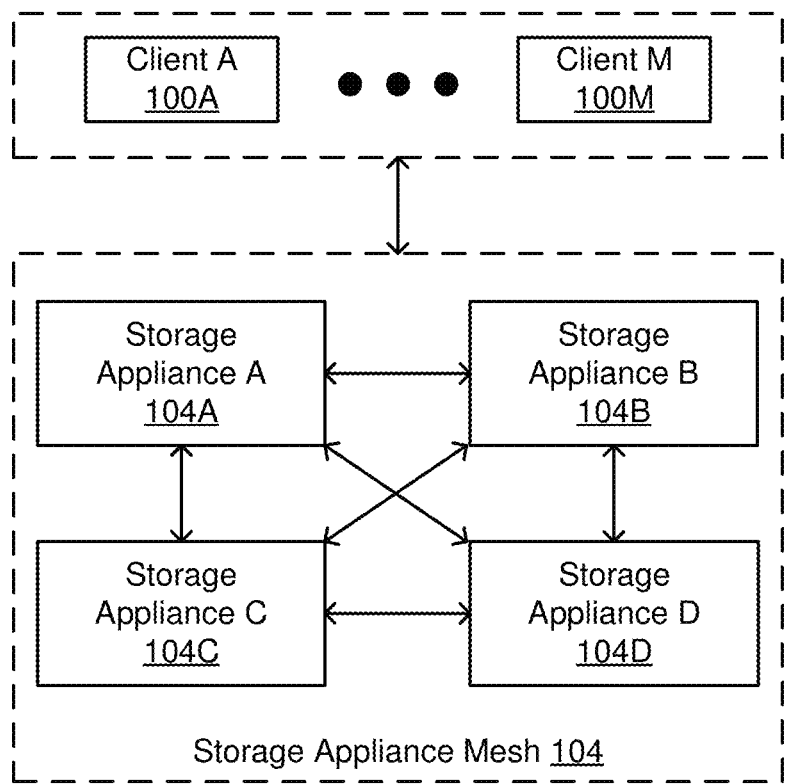
Figure 1C:
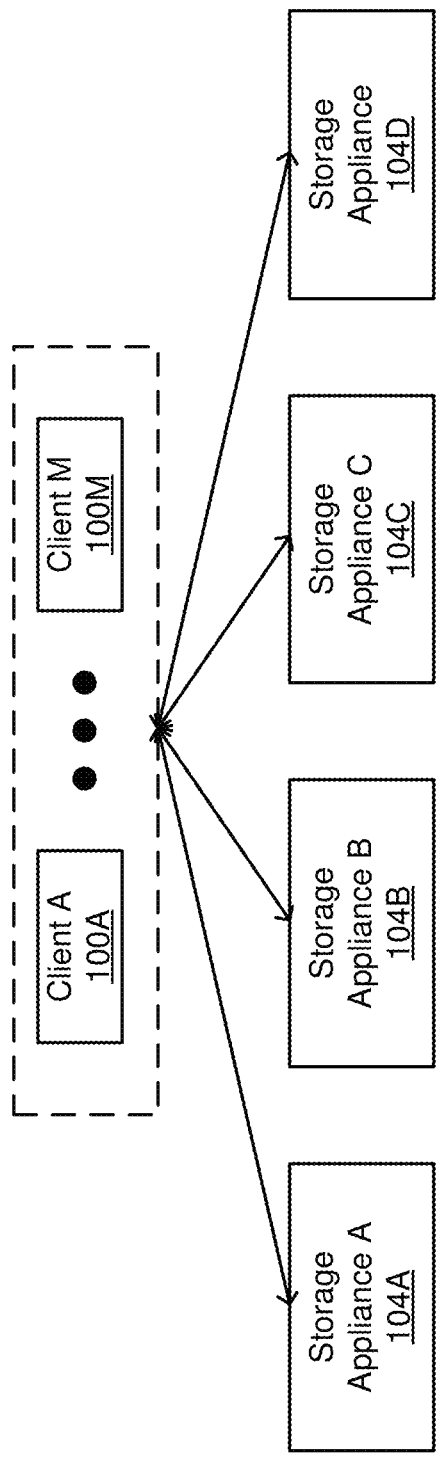

FIGS. 1A-1C show systems in accordance with one or more embodiments of the technology. Referring to FIG. 1A, the system includes one or more clients (client A (100A), client M (100M)) operatively connected to a storage appliance (102).

In one embodiment of the technology, clients (100A, 100M) correspond to any physical system that includes functionality to issue a read request to the storage appliance (102) and/or issue a write request to the storage appliance (102). Though not shown in FIG. 1A, each of the clients (100A, 100M) may include a client processor (not shown), client memory (not shown), and any other software and/or hardware necessary to implement one or more embodiments of the technology.

In one embodiment of the technology, the client (100A-100M) is configured to execute an operating system (OS) that includes a file system. The file system provides a mechanism for the storage and retrieval of files from the storage appliance (102). More specifically, the file system includes functionality to perform the necessary actions to issue read requests and write requests to the storage appliance. The file system also provides programming interfaces to enable the creation and deletion of files, reading and writing of files, performing seeks within a file, creating and deleting directories, managing directory contents, etc. In addition, the file system also provides management interfaces to create and delete file systems. In one embodiment of the technology, to access a file, the operating system (via the file system) typically provides file manipulation interfaces to open, close, read, and write the data within each file and/or to manipulate the corresponding metadata.

Continuing with the discussion of FIG. 1A, in one embodiment of the technology, the clients (100A, 100M) are configured to communicate with the storage appliance (102) using one or more of the following protocols: Peripheral Component Interconnect (PCI), PCI-Express (PCIe), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one embodiment of the technology, the storage appliance (102) is a system that includes volatile and persistent storage and is configured to service read requests and/or write requests from one or more clients (100A, 100M). Various embodiments of the storage appliance (102) are described below in FIG. 2.

Referring to FIG. 1B, FIG. 1B shows a system in which clients (100A, 100M) are connected to multiple storage appliances (104A, 104B, 104C, 104D) arranged in a mesh configuration (denoted as storage appliance mesh (104) in FIG. 1B). As shown in FIG. 1B, the storage appliance mesh (104) is shown in a fully-connected mesh configuration—that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, each of the clients (100A, 100M) may be directly connected to one or more storage appliances (104A, 104B, 104C, 104D) in the storage appliance mesh (104). Those skilled in the art will appreciate that the storage appliance mesh may be implemented using other mesh configurations (e.g., partially connected mesh) without departing from the technology.

Referring to FIG. 1C, FIG. 1C shows a system in which clients (100A, 100M) are connected to multiple storage appliances (104A, 104B, 104C, 104D) arranged in a fan-out configuration. In this configuration, each client (100A, 100M) is connected to one or more of the storage appliances (104A, 104B, 104C, 104D); however, there is no communication between the individual storage appliances (104A, 104B, 104C, 104D).

Those skilled in the art will appreciate that while FIGS. 1A-1C show storage appliances connected to a limited number of clients, the storage appliances may be connected to any number of clients without departing from the technology. Those skilled in the art will appreciate that while FIGS. 1A-1C show various system configurations, the technology is not limited to the aforementioned system configurations. Further, those skilled in the art will appreciate that the clients (regardless of the configuration of the system) may be connected to the storage appliance(s) using any other physical connection without departing from the technology.

Figure 2:
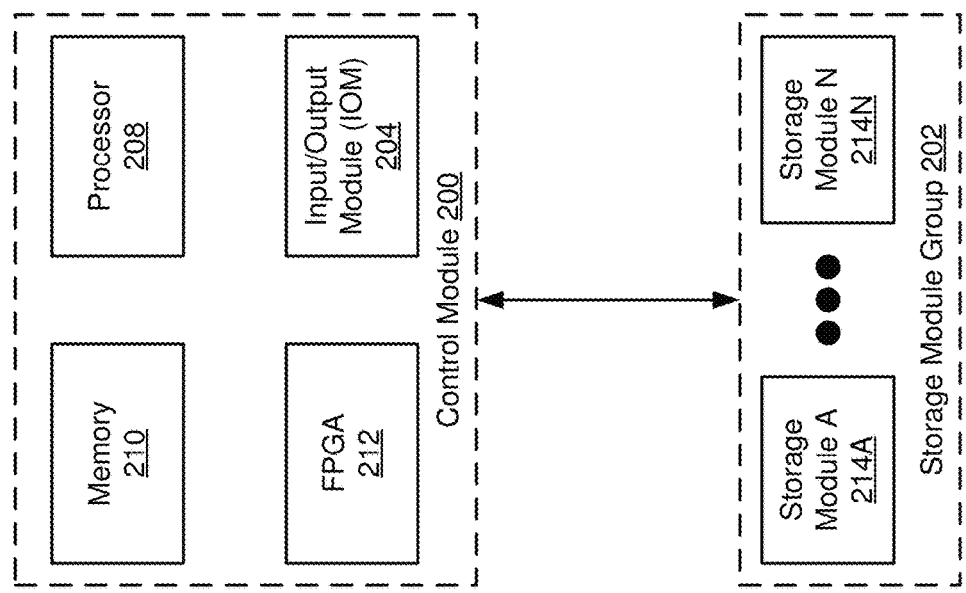
FIG. 2 shows a storage appliance in accordance with one or more embodiments of the technology.

FIG. 2 shows embodiments of a storage appliance in accordance with one or more embodiments of the technology. The storage appliance includes a control module (200) and a storage module group (202). Each of these components is described below. In general, the control module (200) is configured to manage the servicing of read and write requests from one or more clients. In particular, the control module is configured to receive requests from one or more clients via the IOM (discussed below), to process the request (which may include sending the request to a storage module), and to provide a response to the client after the request has been serviced. Additional details about the components in the control module are included below. Further, the operation of the control module with respect to servicing read requests is described below with reference to FIGS. 7A and 7B.

Continuing with the discussion of FIG. 2, in one embodiment of the technology, the control module (200) includes an Input/Output Module (IOM) (204), a processor (208), a memory (210), and, optionally, a Field Programmable Gate Array (FPGA) (212). In one embodiment of the technology, the IOM (204) is the physical interface between the clients (e.g., 100A, 100M in FIGS. 1A-1C) and the other components in the storage appliance. The IOM supports one or more of the following protocols: PCI, PCIe, PCI-X, Ethernet (including, but not limited to, the various standards defined under the IEEE 802.3a-802.3bj), Infiniband, and Remote Direct Memory Access (RDMA) over Converged Ethernet (RoCE). Those skilled in the art will appreciate that the IOM may be implemented using protocols other than those listed above without departing from the technology.

Continuing with FIG. 2, the processor (208) is a group of electronic circuits with a single core or multi-cores that are configured to execute instructions. In one embodiment of the technology, the processor (208) may be implemented using a Complex Instruction Set (CISC) Architecture or a Reduced Instruction Set (RISC) Architecture. In one or more embodiments of the technology, the processor (208) includes a root complex (as defined by the PCIe protocol). In one embodiment of the technology, if the control module (200) includes a root complex (which may be integrated into the processor (208)), then the memory (210) is connected to the processor (208) via the root complex. Alternatively, the memory (210) is directly connected to the processor (208) using another point-to-point connection mechanism. In one embodiment of the technology, the memory (210) corresponds to any volatile memory including, but not limited to, Dynamic Random-Access Memory (DRAM), Synchronous DRAM, SDR SDRAM, and DDR SDRAM.

In one embodiment of the technology, the processor (208) is configured to create and update an in-memory data structure (not shown), where the in-memory data structure is stored in the memory (210). The in-memory data structure may include various information that may be used as described in FIG. 7A. For example, the in-memory structure, in accordance with one or more embodiments of the technology stores read threshold values. Various read threshold values may be relied upon by the method described in FIG. 7A. A further description of the read threshold values is provided below with reference to FIG. 6. The in-memory data structure may further be used to keep track of the state of the solid state memory. For example, the in-memory data structure may include a map of blocks of solid state memory to be used to document whether a block is in an "erased", "opened" or "closed" state, and/or which page of a block was last written, etc. Any data structure type (e.g., arrays, linked lists, hash tables, etc.) may be used to organize the above information within the in-memory data structure(s). Additional details are subsequently provided.

In one embodiment of the technology, the processor is configured to offload various types of processing to the FPGA (212). In one embodiment of the technology, the FPGA (212) includes functionality to calculate checksums for data that is being written to the storage module(s) and/or data that is being read from the storage module(s). Further, the FPGA (212) may include functionality to calculate P and/or Q parity information for purposes of storing data in the storage module(s) using a RAID scheme (e.g., RAID 2-RAID 6) and/or functionality to perform various calculations necessary to recover corrupted data stored using a RAID scheme (e.g., RAID 2-RAID 6). In one embodiment of the technology, the storage module group (202) includes one or more storage modules (214A, 214N) each configured to store data. One embodiment of a storage module is described below in FIG. 3.

Figure 3:
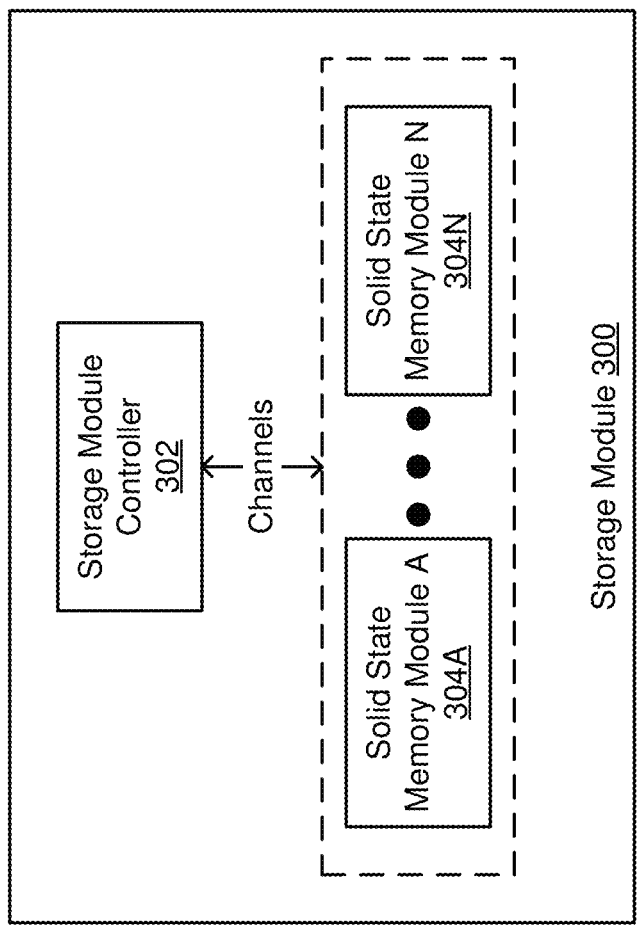
FIG. 3 shows a storage module in accordance with one or more embodiments of the technology.

FIG. 3 shows a storage module in accordance with one or more embodiments of the technology. The storage module (300) includes a storage module controller (302), memory (not shown), and one or more solid-state memory modules (304A, 304N). Each of these components is described below.

In one embodiment of the technology, the storage module controller (300) is configured to receive requests to read from and/or write data to one or more control modules. Further, the storage module controller (300) is configured to service the read and write requests using the memory (not shown) and/or the solid-state memory modules (304A, 304N).

In one embodiment of the technology, the memory (not shown) corresponds to any volatile memory including, but not limited to, Dynamic Random-Access Memory (DRAM), Synchronous DRAM, SDR SDRAM, and DDR SDRAM.

In one embodiment of the technology, the solid-state memory modules correspond to any data storage device that uses solid-state memory to store persistent data. In one embodiment of the technology, solid-state memory may include, but is not limited to, NAND Flash memory and NOR Flash memory. Further, the NAND Flash memory and the NOR flash memory may include single-level cells (SLCs), multi-level cell (MLCs), or triple-level cells (TLCs). Those skilled in the art will appreciate that embodiments of the technology are not limited to storage class memory, and further that memory cells may include any number of levels.

Figure 4:
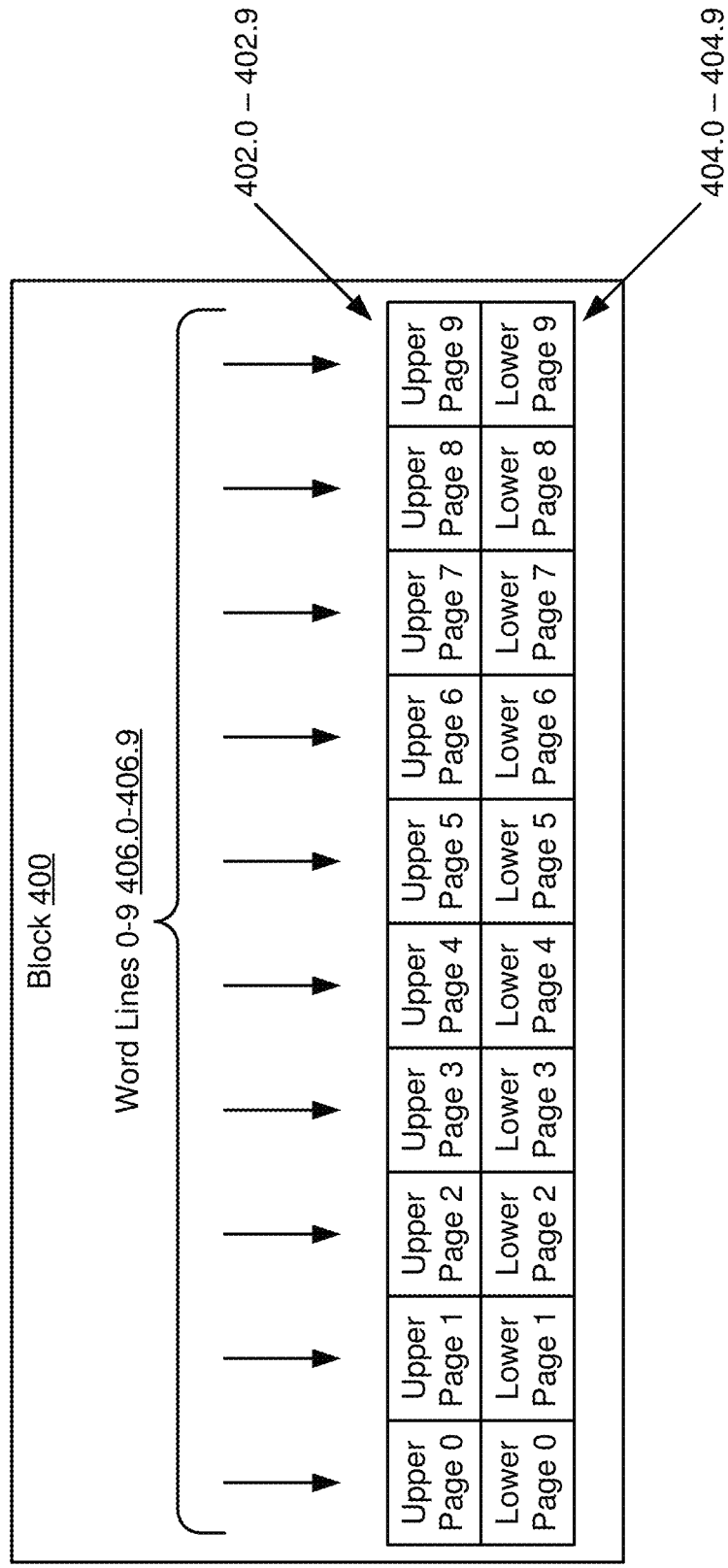
FIG. 4 shows an organization of a memory block in a storage module in accordance with one or more embodiments of the technology.

FIG. 4 shows the organization of a memory block in a storage module in accordance with one or more embodiments of the technology. In one or more embodiment of the technology, the solid-state memory in a solid-state memory module is organized in blocks. A solid state memory module may include any number of blocks, and a block may be the smallest erasable unit in the solid-state memory module. A block (400) is further organized in pages. A block may include many pages that may be written to individually. Although the block (400) is shown as including 20 pages, those skilled in the art will appreciate that a block may include any number of pages. In the shown example of MLC Flash memory, upper pages (402) and lower pages (404) may exist. For example, a block may include 256 pages, consisting of 128 lower pages and 128 upper pages. The exemplary block (400) includes ten upper pages (402.0-402.9) and ten lower pages (404.0-404.9). In one embodiment of the technology, pairs of pages are grouped in word lines (406). For example, upper page 0 (402.0) and lower page 0 (404.0) form word line 0 (406.0).

In one embodiment of the technology, writes may be performed to a block in a particular order. The order may be specific to the design of the solid state memory module. Consider, for example, the exemplary block shown in FIG. 5. The shown block is an open block because it includes written and non-written pages. The written pages, shown with a black background, contain data. The non-written pages, shown with a white background, do not yet contain user-written data. In contrast, a block that only includes non-written pages is an erased block, and a block that only includes written pages is a closed block. In the exemplary block of FIG. 5, pages are being written to in an order from left to right, with upper pages being written before lower pages. Accordingly, the written pages of the open block in FIG. 5 have been written in the order "upper page 0-lower page 0-upper page 1-lower page 1-upper page 2-lower page 2-upper page 3". The next page to be written would thus be lower page 3. Those skilled in the art will recognize that the order in which pages are written may deviate from this exemplary order, without departing from the technology.

Depending on whether pages have been written to, word lines may be labeled as "closed word lines", "open word lines" and "erased word lines". A closed word line, in accordance with an embodiment of the technology, is a word line that only includes written pages (also referred to as programmed pages). An open word line includes at least one written page and at least one non-written page. An erased word line includes only non-written pages, i.e., pages that are in a state that was generated by erasing these pages. In one embodiment of the technology, an additional distinction is made between a last closed word line, a second-last closed word line and normal-closed word lines. A last closed word line is a closed word line that is immediately adjacent to an open word line. Based on the order in which pages are written, the last closed word line is the word line that most recently changed from an "open word line" status to a "closed word line" status. Further, the second-last closed word line is the word line whose status changed from "open word line" status to "closed word line" immediately prior to the last closed word line. A normal-closed word line is any closed word line that is neither a last closed word line nor a second-last closed word line.

The implication, in accordance with one or more embodiments of the technology, is that pages associated with a last closed word line, a second-last closed word line and a normal-closed word line may be read from, using different read threshold values. Specifically, a page associated with a normal-closed word line is surrounded by other pages that have been programmed. In contrast, a page associated with a last closed word line has at least one non-written page (associated with the open word line) immediately adjacent. Similarly, a page associated with the second-last closed word line has at least one page (associated with the open word line) in the vicinity. As previously discussed, programming memory cells in pages causes a voltage bias in memory cells of adjacent pages, thus slightly elevating the stored charges. Because the pages associated with the normal-closed word line are surrounded by written pages, the cells in these pages have experienced the full voltage bias and may thus be read from using a default read threshold value. In contrast, memory cells in pages associated with the second-last and the last closed word line have not yet experienced the full bias because non-programmed pages remain in the vicinity. Accordingly, read threshold values lower than the default read threshold value may be used to read from these pages, in accordance with one or more embodiments of the technology.

In one or more embodiments of the technology, a read operation may target any page of any closed word line. Read threshold values may be used for read operations, as illustrated in FIG. 6.

Figure 6:
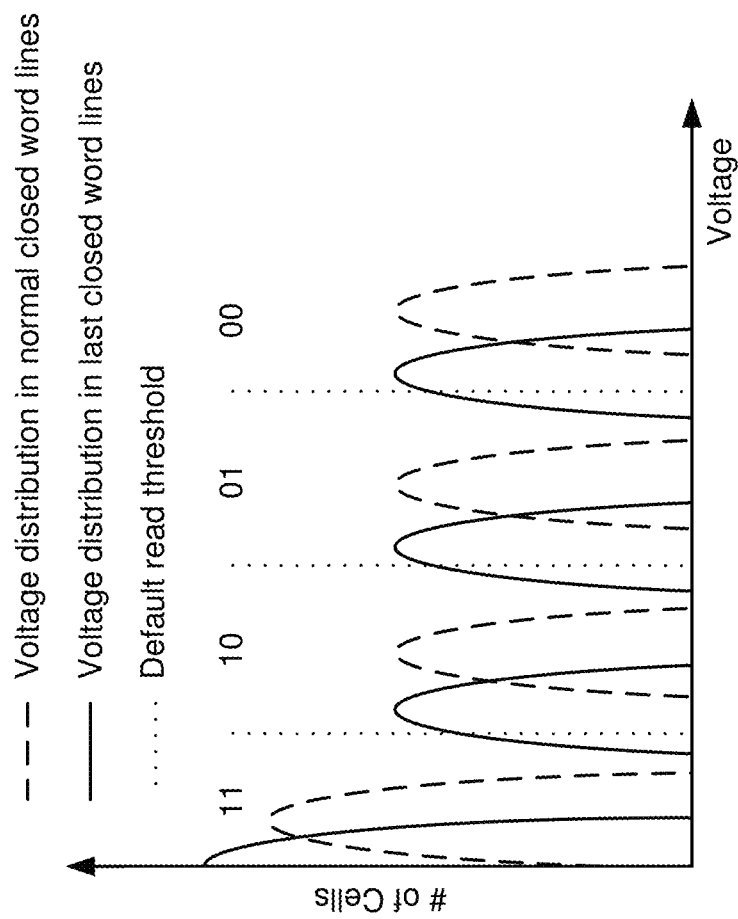
FIG. 6 shows voltage distributions of memory cells in accordance with one or more embodiments of the technology.

FIG. 6 shows voltage distributions of memory cells in accordance with one or more embodiments of the technology. The distributions are obtained from multiple memory cells for which the voltages have been measured after programming. The chart in FIG. 6 shows voltage levels of multi-level cells, where the programmed voltages may represent the logical values "00", "01", "10", and "11". When reading from a cell, the logical value may be determined by comparing the measured voltage of the memory cell to one or more read threshold values. FIG. 6 shows default read threshold values (dotted lines), which reliably separate the voltage distributions of the logical values for cells that are located in pages of normal-closed word lines (distributions shown using dashed lines). However, the default read threshold values do not reliably separate the voltage distributions of the logical values for cells that are located in pages of last closed word lines (distribution shown using solid lines). These distributions are slightly offset to lower voltage levels due to the lack of bias from the programming of adjacent pages, as previously described. The read threshold values would need to be lowered from the default read threshold values, in order to reliably separate those distributions.

Figure 5:
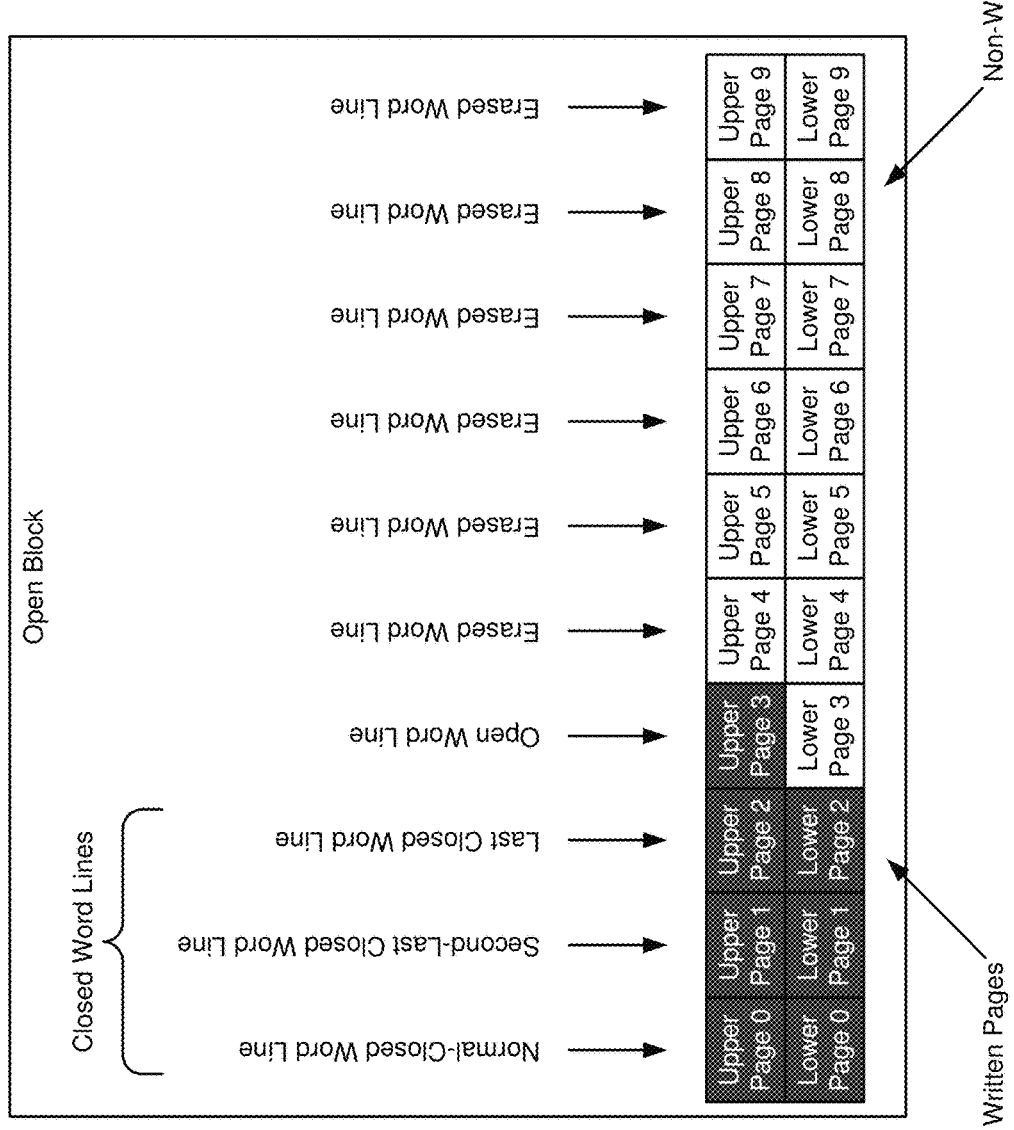
FIG. 5 shows an exemplary memory block in accordance with one or more embodiments of the technology.

As FIGS. 5 and 6 illustrate, different read thresholds may thus be necessary depending on for which word line a read operation is performed. More specifically, the default read threshold value may be applied for any read operations that target memory cells located in pages associated with normal-closed word lines. In contrast, if a read operation targets a page associated with the last closed word line, an offset may need to be applied to the default read threshold value in order to obtain a lower read threshold value. The offset may be generated by applying a shift to the default read threshold value. A smaller offset may need to be applied for read operations that target pages associated with the second-last closed word line. As previously described, the read threshold value depends on the degree by which the memory cells in a page have been biased due to write operations to adjacent pages. While the bias caused by write operations to adjacent pages has elevated the voltages of memory cells in pages of normal closed word lines to the expected level, thus enabling the use of the default read threshold value, the bias is less for the pages of the second-last closed word line and even less for the pages of the last closed word line, thus requiring a deviation from the default read threshold in order to avoid erroneous readings.

If instead the default read threshold value is used (instead of a non-default read threshold value), then there is a higher likelihood that an incorrect logical value (e.g., "11" instead of "10") is obtained when reading from the memory cell. This, in turn, results in the need for additional read operations or other error correction mechanisms such as RAID reconstruction (i.e., correction of errors within retrieved data using one or more parity values) in order to correct the error in the retrieve data and ultimately provide error-free data to the requesting client. The use of error correction mechanisms increases the time required to service a client read request and consequently decreases the performance of the storage appliance.

Proper read threshold values may be determined e.g., based on a prior characterization of a block. Specifically, evaluation writes may be performed to memory cells in the pages of the block, and the cell voltages may subsequently be assessed to determine optimal read threshold values for various read scenarios, including read operations that target normal-closed word lines, second-last closed word lines and last closed word lines. The optimal read threshold value for a given word line or a given page in a word line is the read threshold value that results in the lowest bit error rate (BER) in data retrieved from a solid-state memory module. Read threshold values may additionally or alternatively be obtained via modeling and/or simulation, which consider known characteristics of the block. The read threshold values may be stored in the in-memory structure, e.g., in the memory (210) of the control module (200). Those skilled in the art will recognize that while the read threshold values, for the purpose of assessing an actual cell voltage, are voltage thresholds (see, e.g., FIG. 6), the read threshold values may be stored in various formats, including lookup tables of voltages, voltage offsets and/or unitless numbers. Separate read threshold values may be stored for the different pages, or globally or regionally valid read threshold values may be stored.

In one embodiment of the technology, read threshold values are provided for each page, (i) for the scenario in which the page is in a normal-closed word line, (ii) for the scenario in which the page is in a second-last closed word line, and (iii) for the scenario in which the page is in a last closed word line. All read threshold values may be stored in the memory (210) of the control module (200), e.g. in separate lookup tables.

In another embodiment of the technology, the memory (210) only stores non-default read threshold values for each of the pages. In this scenario read threshold values are stored for the scenario in which the page is in a second-last closed word line, for the scenario in which the page is in a last closed word line, but not for the scenario in which the page is in a normal-closed word line.

Those skilled in the art will appreciate that while the above description discusses read threshold values that are specific to pages, the granularity of the read threshold values may differ without departing from the technology. For example, read threshold values may alternatively be stored per word line. Further, because multiple read threshold values may exist per memory cell (e.g., three read threshold values in an MLC cell, as illustrated in FIG. 6), separate shifts may be determined and stored for each of these read threshold values.

In one embodiment of the technology, the above considerations regarding adjustments of the read threshold values are unnecessary when reading from a closed block, i.e., a block that contains only written pages. To read from any page of a closed block, the default read threshold values may be applicable. In one or more embodiments of the technology, no read-threshold lookup may need to be performed when relying on default read threshold values.

Turning to the flowcharts, while the various steps in the flowchart are presented and described sequentially, one of ordinary skill will appreciate that some or all of the Steps may be executed in different orders, may be combined or omitted, and some or all of the steps may be executed in parallel.

Figure 7A:
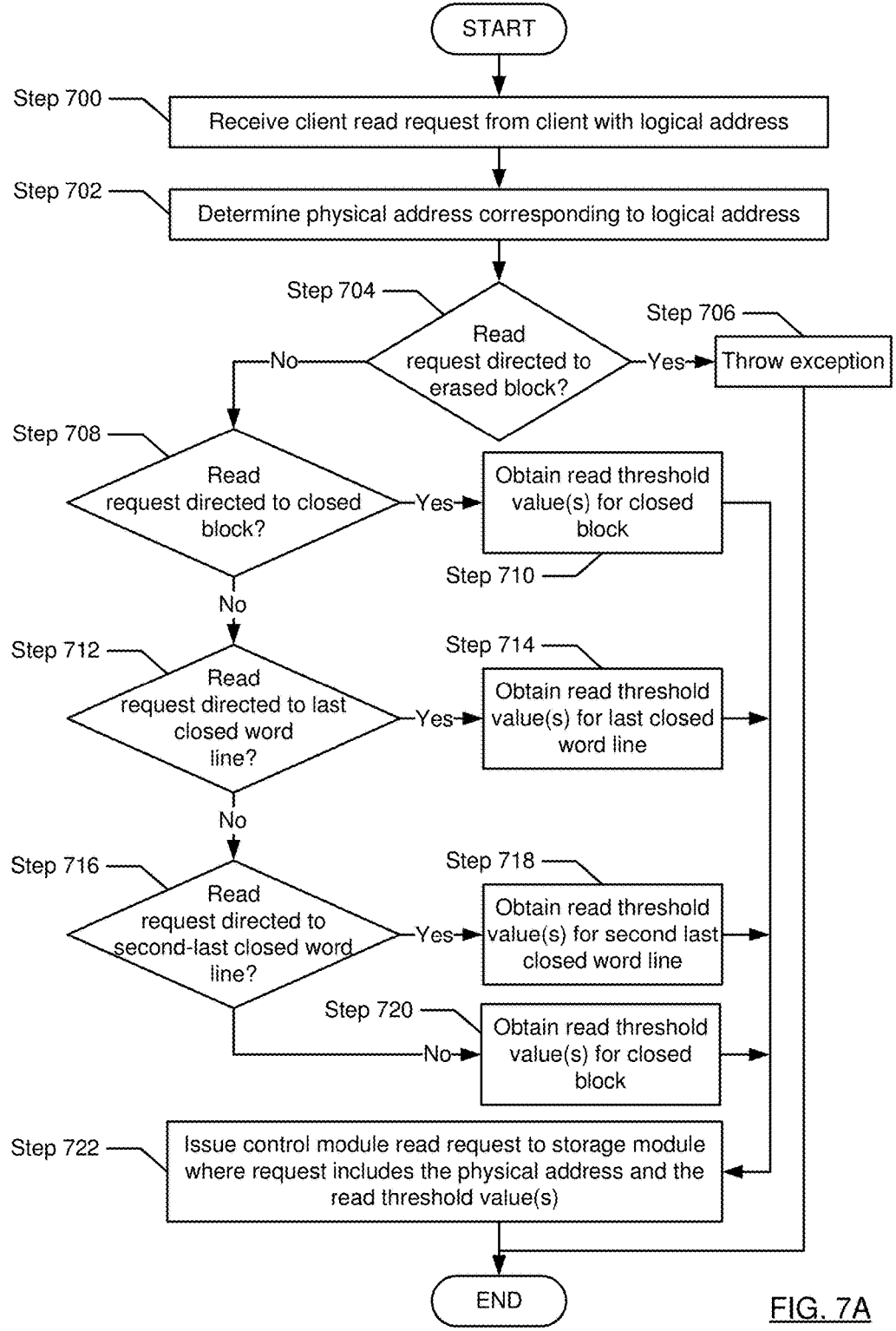
FIGS. 7A and 7B show methods for reading data from a storage module in accordance with one or more embodiments of the technology.

FIG. 7A shows a method for processing client read requests by a storage appliance in accordance with one or more embodiments of the technology.

In Step 700, a client read request is received by the control module from a client, where the client read request includes a logical address.

In Step 702, a physical address (which includes the page number) is determined from the logical address.

The physical address may be determined from the logical address using a mapping of logical addresses to physical addresses, stored e.g. in the memory (210) of the control module (200). In one embodiment of the technology, the logical address is an address at which the data appears to reside from the perspective of the client (e.g., 100A, 100M in FIG. 1A). Said another way, the logical address corresponds to the address that is used by the file system on the client when issuing a read request to the storage appliance.

In one embodiment of the technology, the physical address corresponds to a physical location in a solid-state memory module (304A, 304N) in FIG. 3. In one embodiment of the technology, the physical address includes information that identifies the storage module the chip, the block, and the page to read from. Those skilled in the art will appreciate that the physical address may include any type of information that is required to address a particular physical location where a read operation is to be performed.

In Step 704, a determination is made about whether the read request is directed to an erased block, i.e., a block to which no data has been written. The determination may be made by looking up the state of the block to which the read request is directed. The state of the block may be marked as, for example, "opened", "closed" or "erased" in the memory of the control module. Alternatively, the state of the block may be determined based on an analysis of prior page programming activity within the block. If no programming was observed for the block, since the last erasure of the block, the block may be considered erased. If a determination is made that the read request is directed to an erased block, an exception is thrown in Step 706. An error message may be returned to the client, and the execution of the method may terminate without issuance of a control module read request. If a determination is made that the read request is not directed to an erased block, the method may proceed to Step 708.

In Step 708, a determination is made about whether the read request is directed to a closed block. The determination may be made by looking up the state of the block to which the read request is directed. Alternatively, the state of the block may be determined based on an analysis of prior page programming activity within the block. If all pages of the block have been programmed, the block may be considered closed. If a determination is made that the read request is directed to a closed block, a read threshold value(s) for a closed block may be obtained in Step 710. The read threshold value(s) may be a default read threshold value, or a custom read threshold value that is specific to, for example, the particular page that is being targeted by the read operation. The read threshold value may be obtained from an in-memory data structure (e.g., a lookup table) located in the memory of the control module. No read threshold value may be obtained if the default read threshold value is to be used for the read operation. If a determination is made that the read request is not directed to a closed block, the method may proceed to Step 712.

In Step 712, a determination is made about whether the read request is directed to a last closed word line of the open block. The determination may be made based on a known writing sequence that establishes the order in which pages are written in the block, and based on the last written page of the block, as previously illustrated in FIG. 5. The location of the last written page may be retrieved from the memory of the control module. Based on the location of the last written page and further based on the known order used for writing pages, a determination can be made for any word line of the block, whether the word line is an erased word line, a normal-closed word line, a second-last closed word line or a last closed word line. If a determination is made that the read request is directed to a last closed word line, a read threshold value(s) for a last closed word line may be obtained in Step 714. The read threshold value(s) may be obtained from the in-memory data structure (e.g., a lookup table for last closed word lines) located in the memory of the control module. If a determination is made that the read request is not directed to a last closed word line, the method may proceed to Step 716.

In Step 716, a determination is made about whether the read request is directed to a second-last closed word line of the open block. Analogous to the determination made in Step 712, the determination of Step 716 may be made based on the known order in which pages are written in the block, and based on the last written page of the block. If a determination is made that the read request is directed to a second-last closed word line, a read threshold value(s) for a second-last closed word line may be obtained in in Step 718. The read threshold value(s) may be obtained from the in-memory data structure (e.g., a lookup table for second-last closed word lines) located in the memory of the control module. If a determination is made that the read request is not directed to a last closed word line, the method may proceed to Step 720, where a read threshold value(s) for a closed block is obtained, as previously described in Step 710.

In Step 722, a control module read request is generated using the one or more read threshold value(s) obtained in Steps 710, 714, 718, or 720, and the physical address. The format of the control module read request may be any format that is supported by the storage module controller. In scenarios in which default read threshold values are used (e.g., read threshold values for close blocks) these read threshold values may not be transmitted with the control module read request.

Figure 7B:
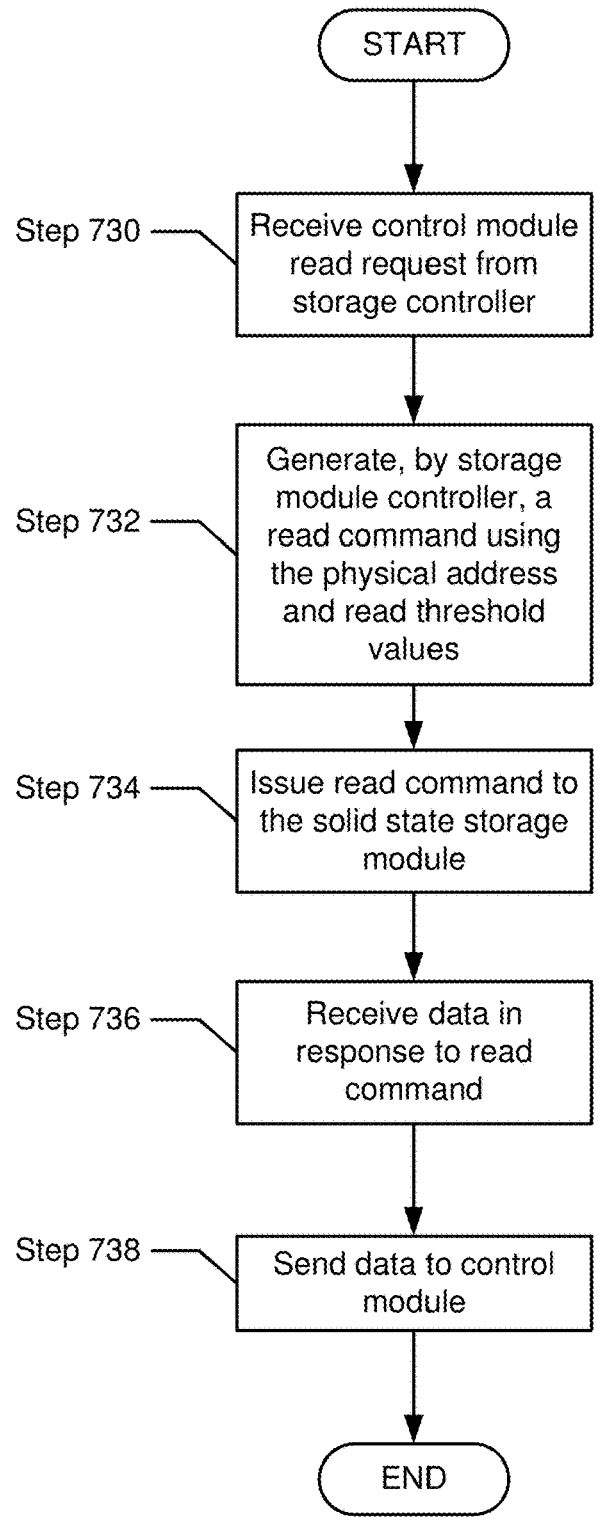

FIG. 7B shows a method for processing control module read requests in accordance with one or more embodiments of the technology. More specifically, FIG. 7B is performed by the storage module controller.

In Step 730, the control module read request is received from the control module. In Step 732, a read command is generated by the storage controller module based on the one or more read threshold value(s) and the physical address in the control module read request. In one embodiment of the technology any given read command generated in Step 732 may specify one or more read threshold values. If the control module does not include any read threshold values. then the default read threshold values are used to generate the read command. If the control module read request includes read threshold values that are in the form of shift values (described above), then generating the read command may include obtaining the default read threshold values and modifying one or more read threshold values using the shift value(s). The read command may be in any format that is supported by the solid-state memory modules.

In Step 734, the read command is issued to the solid-state memory module. In Step 736, data is received, by the storage module controller, in response to the read command. In Step 738, the retrieved data is provided to the control module. The control module subsequently provides the data to the client. In one embodiment of the technology, the storage module controller may include functionality to directly transfer the retrieved data to the client without requiring the data to be temporarily stored in the memory on the control module.

Figure 8:
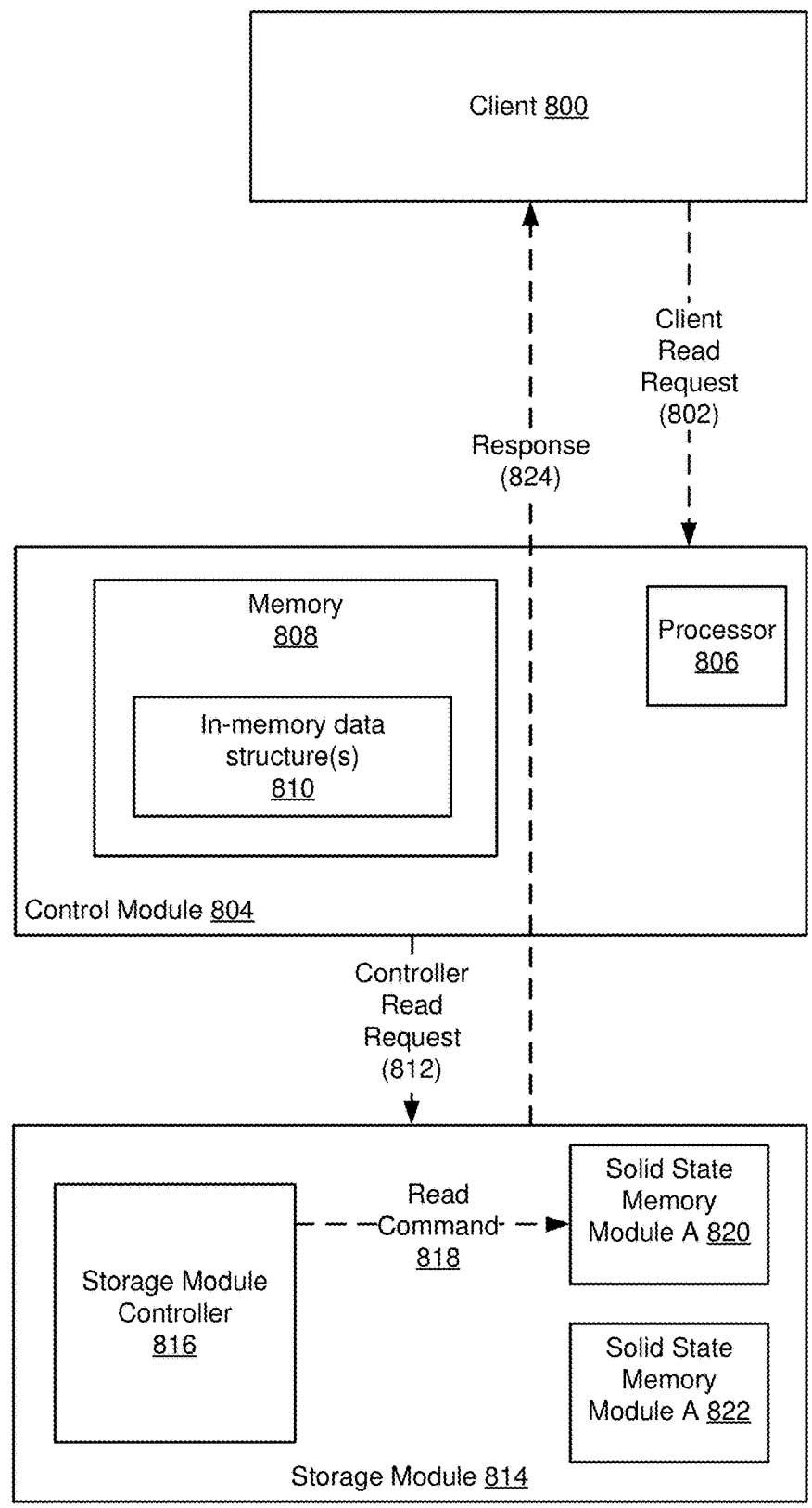
FIG. 8 shows an example in accordance with one or more embodiments of the technology.

FIG. 8 shows an example in accordance with one or more embodiments of the technology. The following example is not intended to limit the scope of the technology.

Turning to FIG. 8, consider a scenario in which a client (800) issues a client read request (802), which includes a logical address, to a storage appliance that includes a control module (804) and at least one storage module (814). The control module (804) receives the client read request and generates a controller read request (812) using the method described in FIG. 7A using the processor (806) and one or more in-memory data structures (810) stored in the memory (808) on the control module. More specifically, the control module, using one or more in-memory data structures (810), determines the physical address (PA) that corresponds to the logical address. The control module then identifies the block that houses the memory location identified by the physical address and further determines, if the block is an open block, whether the memory location is associated with a normal closed word line, a last closed word line or a second-last closed word line. Subsequently, the control module performs a look-up in the in-memory data structure(s) to obtain at least one read threshold value, specific to the identified word line.

In this example assume that the solid-state memory module (820, 822) includes MLCs and that the physical address points to a memory location in a block associated with a last closed word line. The aforementioned look-up thus returns read threshold values in the form of offset values valid for the last closed word line. One offset value is returned, to shift all three read threshold values, as previously illustrated in FIG. 6. The control module (804) subsequently generates a controller read request that includes the physical address and the shift value for the read threshold values. The controller read request (812) is subsequently issued to the storage module (814) that includes a solid-state memory module (820, 822) that includes the physical location corresponding to the physical address.

The storage module (814) subsequently receives and services the controller read request (812). More specifically, the storage module controller (812) generates and issues a read command (818) to the solid-state memory module that includes the physical location corresponding to the physical address. The solid state memory module executes the read request by performing a comparison of the voltage(s) of the memory cell(s), addressed by the physical address, with the read threshold value(s). Based on the comparison, the logical state(s) of the memory cell(s) are determined and returned as data.

The storage module controller subsequently receives the data from the solid-state memory module and then provides the data (in a response (824)) to the client (800). The data may be directly copied from a memory (not shown) in the storage module to a client memory (not shown).

Comparison of read operations performed using an embodiment of the technology to a conventional read approach (no read-threshold compensation) in a realistic scenario that included read operations from a mix of pages located in normal-closed word lines, second-last closed word lines and last closed word lines have shown an approximately 100-fold reduction in read errors. Accordingly, embodiments of the technology may reduce the need for time-consuming read retries and/or may eliminate latencies associated with alternative methods for interference compensation and/or other additional error correction mechanisms such as RAID. Further, the technology also reduces the number of uncorrectable errors.

One or more embodiments of the technology may be implemented using instructions executed by one or more processors in the storage appliance. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for reading data from persistent storage, the method comprising:
   receiving a first client read request for first data from a client, wherein the first client read request comprises a first logical address;
   determining a first physical address corresponding to the first logical address;
   making a first determination that the first physical address is directed to an open block in the persistent storage;
   making a second determination that the first physical address is directed to a last closed word line of the open block, and based on the first and the second determinations:
      obtaining at least one first read threshold value for reading from the last closed word line of the open block;
      issuing a control module read request comprising the at least one first read threshold value to a storage module, wherein the storage module comprises the open block; and
      obtaining the first data from the open block using the at least one first read threshold value.

2. The method of claim 1, further comprising:
   receiving a second client read request for second data from the client, wherein the second client read request comprises a second logical address;
   determining a second physical address corresponding to the second logical address;
   making a third determination that the second physical address is directed to the open block in the persistent storage;
   making a fourth determination that the second physical address is directed to a second-last closed word line of the open block, and based on the third and the fourth determinations:
      obtaining at least one second read threshold value for reading from the second-last closed word line of the open block;
      issuing a control module read request comprising the at least one second read threshold value to the storage module; and
      obtaining the second data from the open block using the at least one second read threshold value.

3. The method of claim 1, further comprising:
   receiving a second client read request for second data from the client, wherein the second client read request comprises a second logical address;
   determining a second physical address corresponding to the second logical address;
   making a third determination that the second physical address is directed to the open block in the persistent storage;
   making a fourth determination that the second physical address is directed to neither the last closed word line nor to a second-last closed word line of the open block, and based on the third and the fourth determinations:
      obtaining at least one second read threshold value for reading from closed blocks;
      issuing a control module read request comprising the at least one second read threshold value to the storage module; and
      obtaining the second data from the open block using the at least one second read threshold value.

4. The method of claim 1, further comprising:
receiving a second client read request for second data from the client, wherein the second client read request comprises a second logical address;
determining a second physical address corresponding to the second logical address;
making a third determination that the second physical address is directed to a closed block in the persistent storage, and based on the third determination:
obtaining at least one second read threshold value for reading from the closed block;
issuing a control module read request comprising the at least one second read threshold value to the storage module, wherein the storage module comprises the closed block; and
obtaining the second data from the open block using the at least one second read threshold value.

5. The method of claim 1, further comprising:
receiving a second client read request for second data from a client, wherein the second client read request comprises a second logical address;
determining a second physical address corresponding to the second logical address; and
making a third determination that the second physical address is directed to an erased block in the persistent storage, and based on the third determination:
throwing an exception without issuing a control module read request.

6. The method of claim 1,
wherein the last closed word line of the open block is adjacent to an open word line of the open block, and
wherein the open word line comprises at least one written page and at least one non-written page.

7. The method of claim 6,
wherein the open block comprises a multi-level cell (MLC),
wherein, in the open word line, one selected from a group consisting of an upper page of the MLC and a lower page of the MLC is a written page, and
wherein one selected from the group consisting of the upper page of the MLC and the lower page of the MLC is a non-written page.

8. The method of claim 1, wherein obtaining the at least one first read threshold value configured for reading from the last closed word line of the open block comprises performing a look-up in an in-memory data structure.

9. The method of claim 1, wherein the second determination that the first physical address is directed to the last closed word line of the open block is made based on a known writing sequence used for writing to the open block and a known last written page of the open block.

10. The method of claim 1, wherein the at least one first read threshold value comprises at least one voltage value.

11. The method of claim 1, wherein the at least one first read threshold value comprises at least one shift value, wherein the at least one shift value corresponds to at least one voltage shift of at least one default read threshold value.

12. A system, comprising:
a storage module comprising a storage module controller and persistent storage; and
a control module operatively connected to the storage module and a client,
wherein the control module:
receives a first client read request for first data from the client, wherein the first client read request comprises a first logical address;
determines a first physical address corresponding to the first logical address;
makes a first determination that the first physical address is directed to an open block in the persistent storage;
makes a second determination that the first physical address is directed to a last closed word line of the open block, and based on the first and the second determinations:
obtains at least one first read threshold value for reading from the last closed word line of the open block;
issues a control module read request comprising the at least one first read threshold value to the storage module, wherein the storage module comprises the open block; and
wherein the storage module:
receives the control module read request; and
obtains the first data from the open block using the at least one first read threshold value.

13. The system of claim 12,
wherein the control module further:
receives a second client read request for second data from the client, wherein the second client read request comprises a second logical address;
determines a second physical address corresponding to the second logical address;
makes a third determination that the second physical address is directed to the open block in the persistent storage;
makes a fourth determination that the second physical address is directed to a second-last closed word line of the open block, and based on the third and the fourth determinations:
obtains at least one second read threshold value for reading from the second-last closed word line of the open block;
issues a control module read request comprising the at least one second read threshold value to the storage module; and
wherein the storage module further:
obtains the second data from the open block using the at least one second read threshold value.

14. The system of claim 12,
wherein the control module further:
receives a second client read request for second data from the client, wherein the second client read request comprises a second logical address;
determines a second physical address corresponding to the second logical address;
makes a third determination that the second physical address is directed to the open block in the persistent storage;
makes a fourth determination that the second physical address is directed to neither the last closed word line nor to a second-last closed word line of the open block, and based on the third and the fourth determinations:
obtains at least one second read threshold value for reading from closed blocks;
issues a control module read request comprising the at least one second read threshold value to the storage module; and
wherein the storage module further:
obtains the second data from the open block using the at least one second read threshold value.

15. The system of claim 12,
wherein the last closed word line of the open block is adjacent to an open word line of the open block, and
wherein the open word line comprises at least one written page and at least one non-written page.

16. The system of claim 15,
wherein the open block comprises a multi-level cell (MLC),
wherein, in the open word line, one selected from a group consisting of an upper page of the MLC and a lower page of the MLC is a written page, and
wherein one selected from the group consisting of the upper page of the MLC and the lower page of the MLC is a non-written page.

17. The system of claim 12, wherein the second determination that the first physical address is directed to the last closed word line of the open block is made based on a known writing sequence used for writing to the open block.

18. The system of claim 12, wherein the at least one first read threshold value comprises at least one voltage value.

19. The system of claim 12, wherein the at least one first read threshold value comprises at least one shift value, wherein the at least one shift value corresponds to at least one voltage shift of at least one default read threshold value.

20. A non-transitory computer readable medium comprising computer readable program code, which when executed by a computer processor enables the computer processor to:
receive a first client read request for first data from a client, wherein the first client read request comprises a first logical address;
determine a first physical address corresponding to the first logical address;
make a first determination that the first physical address is directed to an open block in persistent storage;
make a second determination that the first physical address is directed to a last closed word line of the open block, and based on the first and the second determinations:
obtain at least one first read threshold value for reading from the last closed word line of the open block;
issue a control module read request comprising the at least one first read threshold value to a storage module, wherein the storage module comprises the open block; and
obtain the first data from the open block using the at least one first read threshold value.

* * * * *